(12) United States Patent  
Shilpiekandula et al.

(10) Patent No.: US 8,390,233 B2
(45) Date of Patent: Mar. 5, 2013

(54) HIGH RESOLUTION FLEXURAL STAGE FOR IN-PLANE POSITION AND OUT-OF-PLANE PITCH/ROLL ALIGNMENT

(75) Inventors: Vijay Shilpiekandula, Cambridge, MA (US); Kamal Youcef-Toumi, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 414 days.

(21) Appl. No.: 12/628,365

(22) Filed: Dec. 1, 2009

(65) Prior Publication Data

US 2010/0116161 A1 May 13, 2010

Related U.S. Application Data

(63) Continuation of application No. PCT/US2008/065484, filed on Jun. 2, 2008.

(60) Provisional application No. 60/941,398, filed on Jun. 1, 2007.

(51) Int. Cl.
*G05B 11/01* (2006.01)

(52) U.S. Cl. ........................................ 318/560; 318/135

(58) Field of Classification Search .................. 318/560, 318/14, 9, 135
See application file for complete search history.

(56) References Cited

U.S. PATENT DOCUMENTS

| 4,525,852 | A | 6/1985 | Rosenberg |
| 5,140,242 | A * | 8/1992 | Doran et al. .................. 318/640 |
| 5,360,974 | A * | 11/1994 | Hammond et al. ...... 250/442.11 |
| 5,991,005 | A | 11/1999 | Horikawa et al. |
| 6,188,150 | B1 * | 2/2001 | Spence .................... 310/12.17 |
| 6,198,525 | B1 * | 3/2001 | Barringer et al. ............... 355/23 |
| 6,324,933 | B1 * | 12/2001 | Waskiewicz et al. ....... 74/490.01 |
| 6,466,324 | B1 * | 10/2002 | Doran ........................... 356/500 |
| 6,467,761 | B1 * | 10/2002 | Amatucci et al. ............... 269/58 |
| 6,635,625 | B2 * | 10/2003 | Theoharides ................... 514/54 |
| 6,688,183 | B2 | 2/2004 | Awtar et al. |
| 6,791,095 | B2 * | 9/2004 | Pan et al. ................. 250/442.11 |
| 6,980,282 | B2 * | 12/2005 | Choi et al. ...................... 355/72 |
| 7,278,298 | B2 | 10/2007 | Hansma et al. |
| 2002/0098426 | A1 | 7/2002 | Sreenivasan et al. |
| 2002/0149758 | A1 | 10/2002 | Poon |

FOREIGN PATENT DOCUMENTS

WO 2005010940 2/2005

* cited by examiner

*Primary Examiner* — Rina Duda
(74) *Attorney, Agent, or Firm* — Gesmer Updegrove LLP

(57) ABSTRACT

An adjustment structure used in conjunction with an imprinting structure is provided. The adjustment structure includes a sample mount for mounting a sample. An actuator mechanism is coupled to the sample mount, the actuator mechanism producing actuated forces on a X-Y plane to produce movements on a sample mount. A plurality of bladed flexures are positioned on the sample mount. The bladed flexures controls the movements of the sample mount produced by the actuator mechanism so as to allow adjustments in angular alignment about the pitch-roll ($\theta_X$-$\theta_Y$) rotation axes or the X-Y plane relative to the sample mount so the imprinting structure can perform its operations on the sample.

22 Claims, 5 Drawing Sheets

HIGH RESOLUTION FLEXURAL STAGE FOR IN-PLANE POSITION AND OUT-OF-PLANE PITCH/ROLL ALIGNMENT

PRIORITY INFORMATION

This application is a continuation of PCT Application No. PCT/US2008/065484 filed Jun. 2, 2008, which claims priority to U.S. Provisional Application No. 60/941,398, filed on Jun. 1, 2007, both of which are incorporated herein by reference in their entireties

BACKGROUND OF THE INVENTION

The invention relates to the field of positioning stages for use in lithography or embossing, and in particular to a high-resolution flexural stage for in-plane position and out-of-plane pitch/roll alignment.

There have been many designs for positioning and alignment stages used in the prior art addressing applications such as lithography, embossing, and stamping of nano-structures. However, many of these designs lack the ability to simultaneously allow alignment in the X-Y plane as well as provide alignment the along pitch-roll ($\theta_X$-$\theta_Y$) rotational axes using the same actuators to achieve either alignment. Moreover, these prior-art stage designs have lower payload capacity and limited resolution, and need at least one actuator per degree-of-freedom, thereby increasing the overall cost of the implementation. Furthermore, passive alignment could be detrimental to the structures being worked on because of stability considerations. The present invention addresses the deficiencies presented in the prior art.

SUMMARY OF THE INVENTION

According to one aspect of the invention, there is provided an adjustment structure used in conjunction with an imprinting structure. The adjustment structure includes a sample mount for mounting a sample. An actuator mechanism is coupled to the sample mount, the actuator mechanism producing actuated forces on a X-Y plane to produce movements on a sample mount. A plurality of bladed flexures are positioned on the sample mount. The bladed flexures control the movements of the sample mount produced by the actuator mechanism so as to allow adjustments in angular alignment about the $\theta_X$-$\theta_Y$ rotation axes or the X-Y plane relative to the sample mount so the imprinting structure can perform its operations on the sample.

According to another aspect of the invention, there is provided a method of implementing an adjustment structure used in conjunction with an imprinting structure. The method includes providing a sample mount for mounting a sample. An actuator mechanism is provide being coupled to the sample mount, the actuator mechanism producing actuated forces on a X-Y plane to produce movements on a sample mount. In addition, the method includes positioning a plurality of bladed flexures on the sample mount. The bladed flexures controls the movements of the sample mount produced by the actuator mechanism so as to allow adjustments in angular alignment about the $\theta_X$-$\theta_Y$ rotation axes or the X-Y plane relative to the sample mount so the imprinting structure can perform its operations on the sample.

According to another aspect of the invention, there is provided a method of performing the operations of an adjustment structure used in conjunction with an imprinting structure. The method includes mounting a sample on a sample mount, and producing actuated forces on a X-Y plane to produce movements on a sample mount. Furthermore, the method includes controlling the movements of the sample mount produced by the actuator forces so as to allow adjustments in angular alignment about the $\theta_X$-$\theta_Y$ rotation axes or the X-Y plane relative to the sample mount so the imprinting structure can perform its operations on the sample.

DETAILED DESCRIPTION OF THE INVENTION

The invention provides a novel positioning and alignment stage for use in embossing, nano-imprint lithography, and other stamping applications. The invention allows for controlling the positioning and alignment between tool and sample because any positioning or alignment errors directly affect the quality of the pattern transfer. The invention is also applicable to designing small-scale gaps formed with smooth and flat walls, and controlled to achieve a range on the order of nanometers to microns, and a fine resolution, on the order of sub-nanometers. Such small-scale gaps can be used for diverse applications in energy, biotechnology and pharmaceuticals, and pattern transfer. The invention provides an alignment structure for the formation of such gaps using optical flats with lateral dimensions on the order of centimeters.

A critical issue for the invention under consideration is maintaining parallelism between the flats, for example, ensuring the gap has a uniform height across the wide area of the flats. The novel alignment mechanism uses flexural components, which ensure friction-less motion.

Figure 1A:
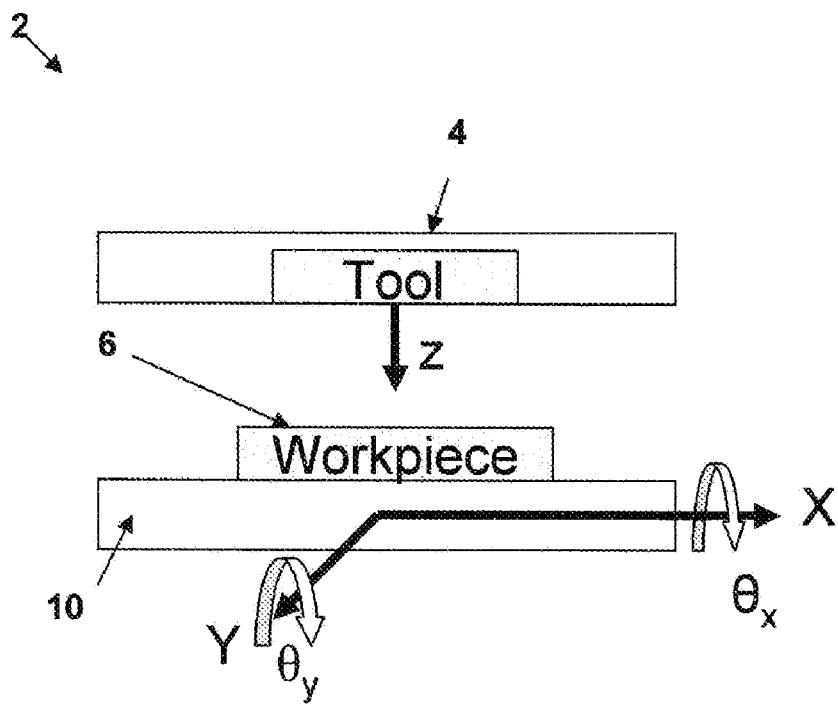
FIG. 1A is a schematic diagram illustrating the basic alignment operations in $\theta_X$-$\theta_Y$ of the invention.
Figure 1B:
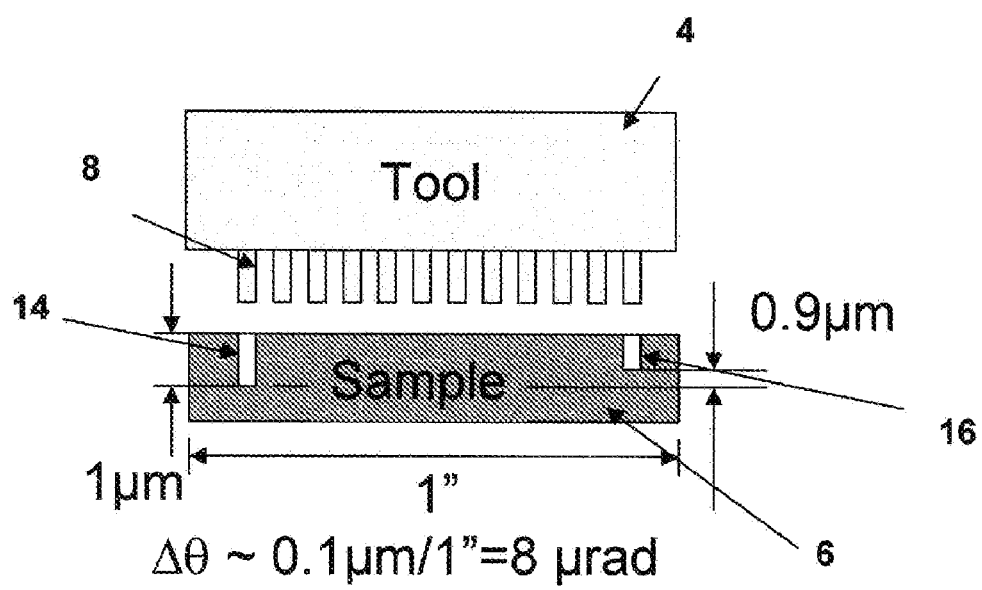
FIG. 1B is a schematic diagram illustrating how $\theta_X$-$\theta_Y$ misalignments can effect the depth size of the gaps produced on a workpiece.

FIG. 1A shows a schematic diagram illustrating the basic operations of the invention. A stamping structure 2 includes a tool 4, a workpiece or sample 6, and a flat 10. In certain stamping structures there can be more then one workpiece 6 being operated on by a tool 4. The X-Y plane and $\theta_X$-$\theta_Y$ axes and their motions relative to the flat 10 are also shown. The tool 4 is used to form gaps on the workpiece 6 of a defined size. FIG. 1B illustrates how rotations can effect the depth size of the gaps produced on the workpiece 6. The tool 4 can include marking elements 8 used in producing gaps on the workpiece. A gap 14 is formed when the markings 8 of tool 4 is vertically pressed upon the surface of the workpiece producing a depth of 1 µm. In this case, there are no rotations on the pitch-roll ($\theta_X$-$\theta_Y$) rotation axes. However, a gap 16 of lesser depth is formed with misalignments on the pitch-roll ($\theta_X$-$\theta_Y$) rotation axes. The depth of gap 16 is measured at 0.9 µm in the presence of a misalignment of 8 µrad on the pitch-roll ($\theta_X$-$\theta_Y$) rotation axes. By varying the rotation around the pitch-roll ($\theta_X$-$\theta_Y$) rotation axes, one can control the depth of a gap formed by the tool 4. This provides great flexibility and control without damaging the workpiece 6.

Figure 1C:
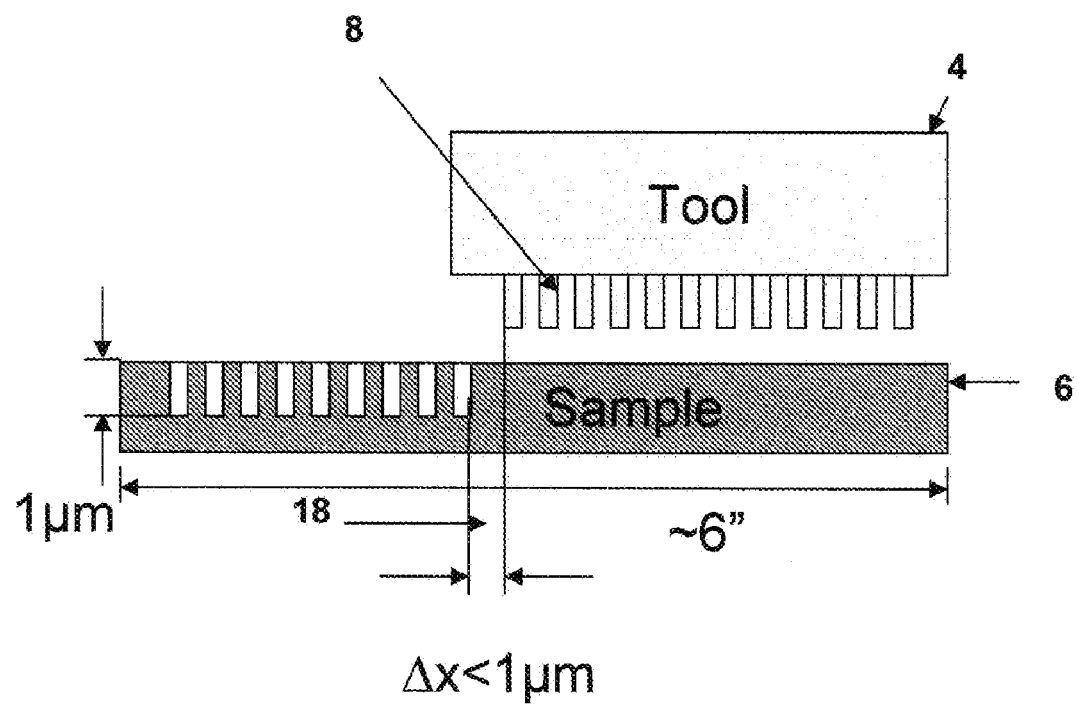
FIG. 1C is a schematic diagram illustrating the effect of X-Y alignment on a stamping structure.

FIG. 1C shows the effect of X-Y alignment on the stamping structure 2. The length of the workpiece 6 is approximately 6 inches, in other embodiments the length can vary. By properly controlling the X-Y alignment, multiple imprints by the tool 4 can be performed. Moreover, the spacing 18 between markings 8 can also be less 1 μm allowing multiple gaps to be formed on a single workpiece 6. The invention provides an alignment structure that allows a workpiece to be rotated about the pitch-roll ($\theta_X$-$\theta_Y$) rotation axes as well as provide X-Y alignment so as to allow a tool to control the number and the depth size of gaps produce on a workpiece simultaneously.

Figure 2:
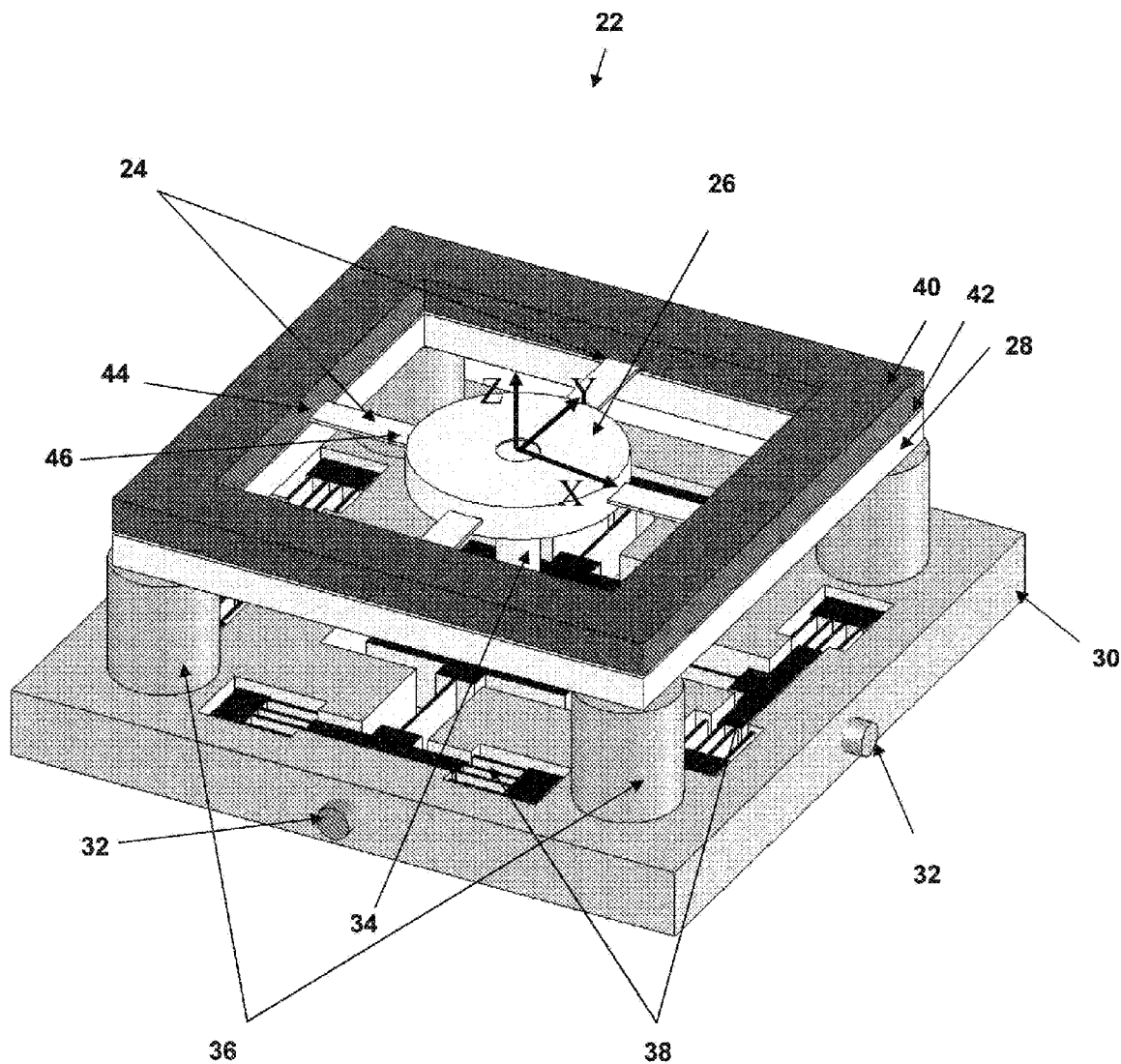
FIG. 2 is a schematic diagram illustrating the inventive alignment structure that allows alignment about the $\theta_X$-$\theta_Y$ rotation axes as well as X-Y alignment.

FIG. 2 shows the inventive alignment structure 22 that allows alignment about the pitch-roll ($\theta_X$-$\theta_Y$) rotation axes as well as X-Y alignment. The alignment structure 22 includes a XY-stage that is parallel to the XY-axis of the alignment structure 22. The XY-stage 30 includes a piezoelectric actuator 32 and flexural components 38 used in the actuation of the alignment structure 22. In addition, the alignment structure 22 includes 4 support structures 36 that are supporting two plate structures 28, 40. A central rigid post 34 is positioned in the middle region of the alignment structure 22, and is connected to a sample mount 26 and providing rigid support for the sample mount 26. The sample mount 26 is connected to the plates 28, 40 via flexible blade flexures 24. The blade flexures 24 are sandwiched between the plates 28, 40 on the distal end 44 and connected to the sample mount 26 on the proximal end 46.

A small gap 42 between the plates 28, 40 is controlled to be closed (or open) to create (or remove) a rigid boundary condition for the blade flexures 24. If the gap is open, the blades are free to move in X-Y plane. If the gap is closed down rigidly, the blades rotate by pitch-roll angles $\theta_X$-$\theta_Y$ along the rotation axes for horizontal forces applied by the piezoelectric actuators 32.

The closing and opening of the gap can be passively achieved by many methods. For example, the plates 28, 40 can have a gap to begin with when the X-Y adjustment is made. In a subsequent step, the gap can be closed down by a set of rigid fasteners to allow for the $\theta_X$-$\theta_Y$ adjustment. Another option is to use a bi-stable link, made from shape memory alloys or other materials, that closes down the spacing when a voltage is applied and opens it when the voltage is turned off. Yet another option is to use an on/off air piston to act on the plate 40 so that it is either rigidly clamped by the air pressure to plate 28, or separated by the gap 42. The control of the gap 42 hence allows for achieving both X-Y and $\theta_X$-$\theta_Y$ adjustments of the sample mount 26 with the same set of actuators placed in the alignment structure 30.

The adjustments along the pitch-roll ($\theta_X$-$\theta_Y$) rotation axes and X-Y plane occur through changes of movement along the central rigid post 34. These changes occur by applying a voltage input to the piezoelectric actuator 30 which results in the flexural components 38 producing X-Y movements along the central rigid post 34. The blade flexures 24 permit controlled movements of the sample mount 26 along the pitch-roll $\theta_X$-$\theta_Y$ rotation axes or the X-Y plane so as to allow a tool positioned above the sample mount to perform its imprinting operations. There are no movements on the z-axis because the central rigid post 34 comprises sufficient stiffness in that direction. A tool can be positioned above the sample mount 26 so as to allow the formation of gaps to occur.

The alignment structure 22 should be amenable for inclusion of any kind of z-actuators if needed. Moreover, in the context of the specific application of stamping, the X-Y alignment of alignment structure 22 can have a range of approximately 1-100 μm, a resolution of better than 10 nm, and a bandwidth on the order of 100 Hz-1 kHz. The $\theta_X$-$\theta_Y$ alignment of alignment structure 22 can have a range of approximately between 1 and 4 mrad, a resolution of better than 1 μrad, and a bandwidth on the order of 100 Hz-1 kHz.

In other embodiments, the blade flexures 24 can be oriented at an angle with respect to the sample mount 26. For example, the plane of the plates 28, 40 can be at a different height when compared with the plane of the sample mount 26. Oriented the blade flexures at an angle can be desirable in specific situations, e.g. minimizing any Abbe offset errors in the pitch/roll alignment.

Figure 3:
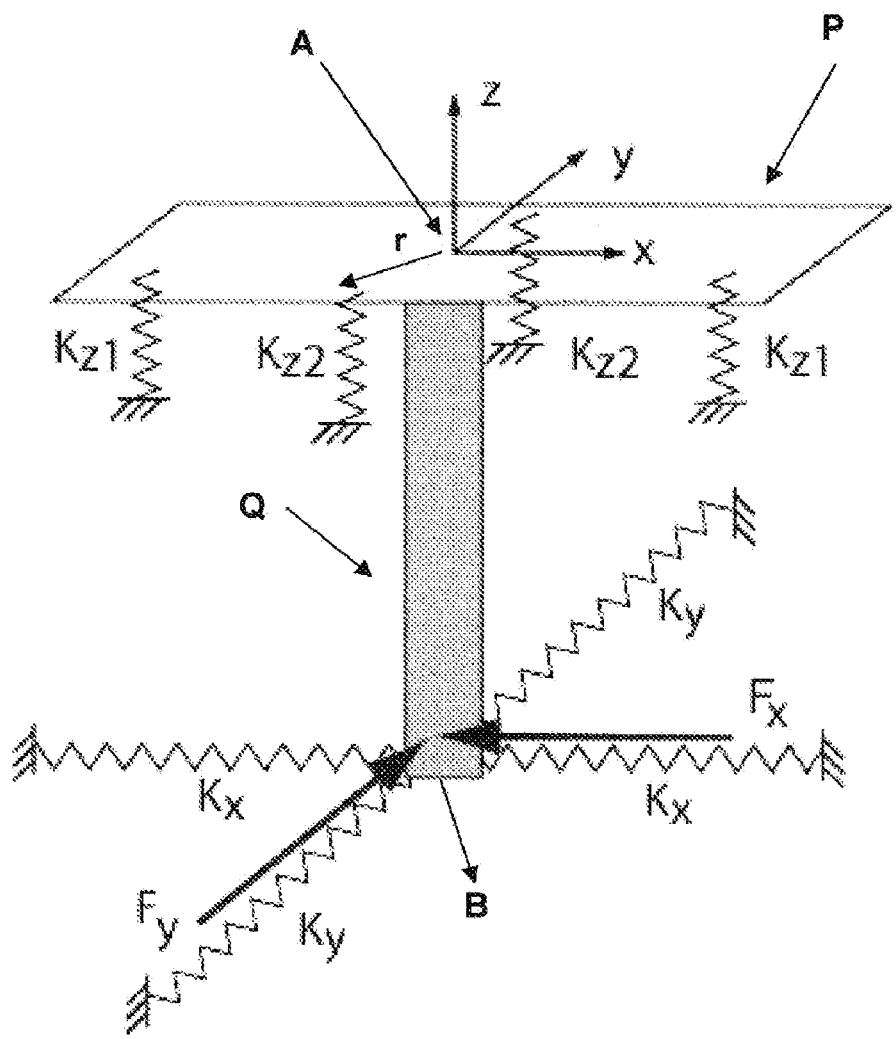
FIG. 3 is a schematic diagram illustrating a simplified lumped parameter model 44 of the novel alignment structure.

FIG. 3 shows a simplified lumped parameter model 44 illustrating the novel alignment stage. The model 44 includes a region P, denoted as a lumped mass and moment of inertia, which denotes the workpiece on the sample mount 26 discussed in FIG. 2. The region P as shown in FIG. 3 is suspended on blade flexures which are lumped as springs with stiffnesses $k_{z1}$-$k_{z2}$ in z-axis. This configuration corresponds to the case when the spacing 42 in FIG. 2 is closed down to create a rigid boundary condition for the blade flexures at their distal end. The central rigid post 34 is shown in model 44 as having a length L. The forces applied on the system are illustrated as $F_x$ and $F_y$ produced by piezoelectric actuators. These forces are shown in FIG. 2 as acting at point B located the bottom of the rigid post 34. The point A located at the top of the rigid post 34 is at the center of the region P.

Note that the combination of the central rigid post 34, blade flexures 38, and sample mount 26 produces very little motion on the z-axis for region P. The motion of region P is defined by spring constants $K_x$ and $K_y$ associated with the motion on the X-axis and Y-axis. By designing the in-plane stiffness of the blade flexures 38 to be high, the displacement of point A can be minimized, making it a pivot point about which the region P rotates under the application of the forces $F_x$ and $F_y$ produced by piezoelectric actuators 32.

Since there are forces being applied on the central rigid post 34, torque is produced leading to the rotation of region P. The relationship of torque in the $\theta_X$ and $\theta_y$-directions is defined as $$J_x \ddot{\theta}_x = F_y l - (2K_{y_1} l^2 + K_{z_2} r^2) \theta_x$$

$$J_y \ddot{\theta}_y = F_x l - (2K_{x_1} l^2 + K_{z_1} r^2) \theta_y \qquad \text{Eq. 1}$$

where $J_x$ and $J_y$ are associated the with moment of inertial on $\theta_X$ and $\theta_Y$ axis and r is the aim length for the location of blade flexures connected to the region P.

For the case when the gap 42 in FIG. 2 is open, i.e. the region P is allowed to move in the X-Y plane. The equations of motion for the X-Y motion are given as $$m\ddot{x} = F_x - 2K_x x$$

$$m\ddot{y} = F_y - 2K_y y \qquad \text{Eq. 2}$$

where m is the total lumped mass contained in region P.

Using these parameters, one can control the alignment along the $\theta_X$-$\theta_Y$ rotation axes and X-Y plane respectively. The invention is based on switching between these two modes of operation by selectively changing the distal boundary condition of the blade flexures.

Figure 4:
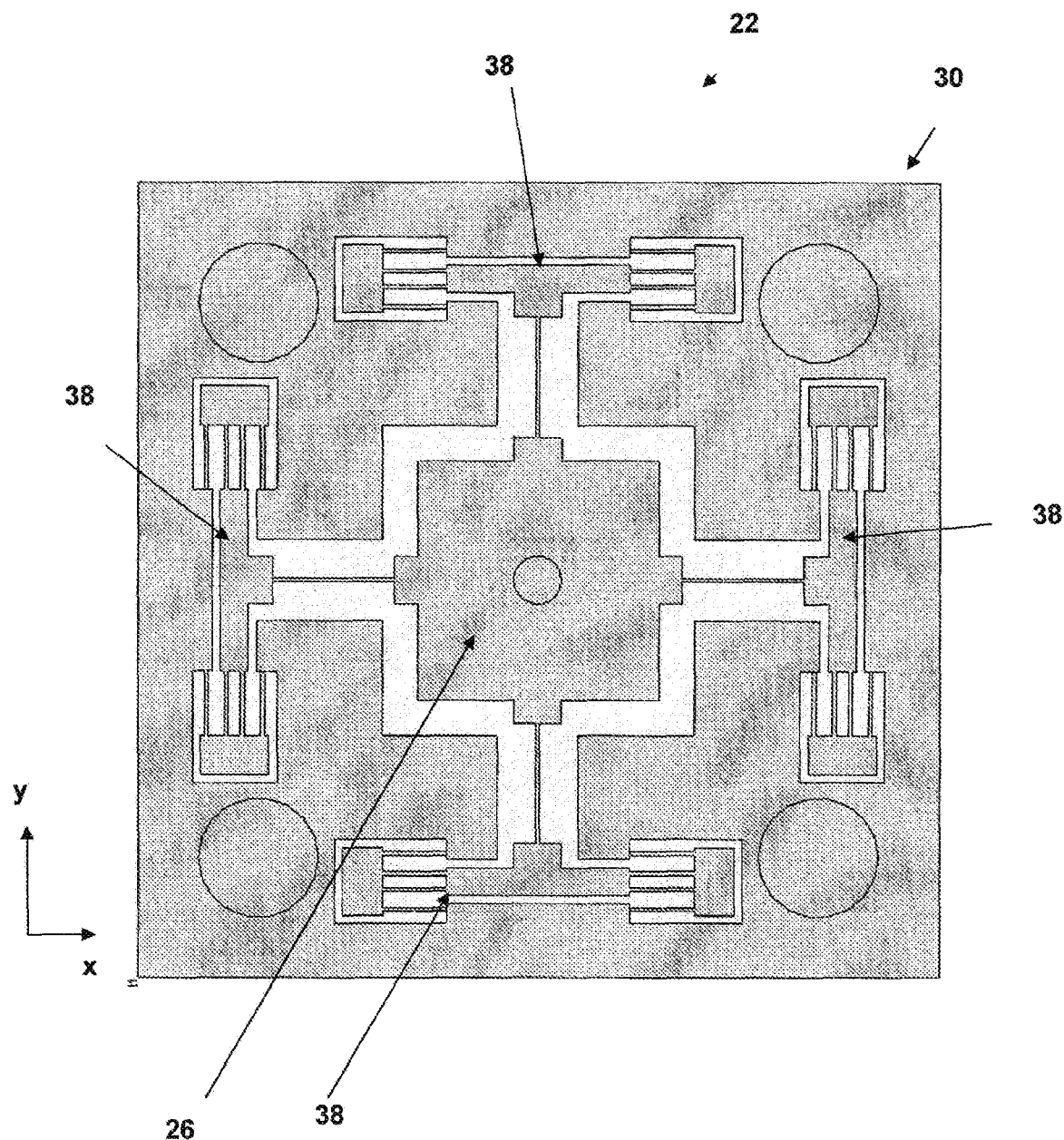
FIG. 4 is a schematic diagram illustrating the top-view of the adjustment structure in the X=Y plane.

The invention disclosed here is not restricted to a particular design for an X-Y adjustment structure. FIG. 4 shows the top-view of an embodiment of an X-Y stage used in the proposed adjustment structure 22. In particular, FIG. 4 illustrates how the X-Y adjustment is accomplished using the XY-stage 30. The sample mount 26 is positioned in the middle region of the adjustment structure 22. Several of the flexural components 38 are connected to the central rigid post 34. These forces in the XY-plane allows for adjustments XY-plane. By computing the forces applied by the flexural components 38, one can use Eq. 1 to compute the necessary parameters to establish their preferred X-Y adjustments.

Although the present invention has been shown and described with respect to several preferred embodiments thereof, various changes, omissions and additions to the form and detail thereof, may be made therein, without departing from the spirit and scope of the invention.

What is claimed is:

1. An adjustment structure used in conjunction with an imprinting structure comprising:
   a sample mount for mounting a sample;
   an actuator mechanism coupled to said sample mount, said actuator mechanism producing actuated forces on a X-Y plane to produce movements on said sample mount;
   a plurality of bladed flexures are positioned on said sample mount, said bladed flexures controlling the movements of the sample mount produced by said actuator mechanism so as to allow adjustments in angular alignment about the pitch-roll ($\theta X$-$\theta Y$) rotation axes as well as said X-Y plane relative to said sample mount so as to allow a tool to control a number and a depth size of gaps produced on the sample.

2. The adjustment structure of claim 1, wherein the said bladed flexures are pinned down on their distal ends to alter the dynamics and associated mode of operation.

3. The adjustment structure of claim 1, wherein said actuator mechanism comprises a piezoelectric actuator.

4. The adjustment structure of claim 1, wherein said bladed flexures comprise of flexible material.

5. The adjustment structure of claim 1, wherein said bladed flexures is positioned between two plates for support.

6. The adjustment structure of claim 1, wherein said sample mount is coupled to a rigid post for support.

7. The adjustment structure of claim 6, wherein said rigid support prevents movements in the vertical axis of said adjustment structure.

8. The adjustment structure of claim 1, wherein said actuator mechanism is positioned on a XY-stage.

9. The adjustment structure of claim 7, wherein said actuator mechanism is coupled to said rigid support.

10. A method of implementing an adjustment structure used in conjunction with an imprinting structure comprising:
    providing a sample mount for mounting a sample;
    providing an actuator mechanism coupled to said sample mount, said actuator mechanism producing actuated forces on a X-Y plane to produce movements on a sample mount; and
    positioning a plurality of bladed flexures on said sample mount, said bladed flexures controlling the movements of the sample mount produced by said actuator mechanism so as to allow adjustments in angular alignment about the pitch-roll ($\theta X$-$\theta Y$) rotation axes as well as said X-Y plane relative to said sample mount so as to allow a tool to control a number and a depth size of gaps produced on the sample.

11. The method of claim 10, wherein said actuator mechanism comprises a piezoelectric actuator.

12. The method of claim 10, wherein said bladed flexures comprise of flexible material.

13. The method of claim 10, wherein said bladed flexures is positioned between two plates for support.

14. The method of claim 10, wherein said sample mount is coupled to a rigid post for support.

15. The method of claim 14, wherein said rigid support prevents movements in the vertical axis of said adjustment structure.

16. The method of claim 10, wherein said actuator mechanism is positioned on a XY-stage.

17. The method of claim 15, wherein said actuator mechanism is coupled to said rigid support.

18. A method of performing the operations of an adjustment structure used in conjunction with an imprinting structure comprising:
    mounting a sample on a sample mount;
    producing actuated forces on a X-Y plane to produce movements on a sample mount; and
    controlling the movements of the sample mount produced by said actuator forces so as to allow adjustments in angular alignment about the pitch-roll ($\theta X$-$\theta Y$) rotation axes as well as said X-Y plane relative to said sample mount so as to allow a tool to control a depth size of a plurality of gaps produced on the sample.

19. The method of claim 18, wherein said sample mount is coupled to a rigid post for support.

20. The method of claim 19, wherein said rigid support prevents movements in the vertical axis of said adjustment structure.

21. The method of claim 20, wherein said blade flexures are oriented at an arbitrary angle with respect to the plane of the X-Y stage.

22. The method of claim 21, wherein said plates at the distal end of the said blade flexures are at a different height with respect to the said sample mount.

* * * * *